(12) United States Patent
Francom et al.

(10) Patent No.: US 9,178,502 B2
(45) Date of Patent: Nov. 3, 2015

(54) APPARATUS FOR A MONOTONIC DELAY LINE, METHOD FOR FAST LOCKING OF A DIGITAL DLL WITH CLOCK STOP/START TOLERANCE, APPARATUS AND METHOD FOR ROBUST CLOCK EDGE PLACEMENT, AND APPARATUS AND METHOD FOR CLOCK OFFSET TUNING

(71) Applicants: Erin D. Francom, Fort Collins, CO (US); Jayen J. Desai, Wellington, CO (US); Matthew R. Peters, Fort Collins, CO (US); Nicholas J. Denler, Beaverton, OR (US)

(72) Inventors: Erin D. Francom, Fort Collins, CO (US); Jayen J. Desai, Wellington, CO (US); Matthew R. Peters, Fort Collins, CO (US); Nicholas J. Denler, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/142,452

(22) Filed: Dec. 27, 2013

(65) Prior Publication Data

US 2015/0188527 A1 Jul. 2, 2015

(51) Int. Cl.
*H03H 11/16* (2006.01)
*H03K 5/13* (2014.01)
*H03K 5/14* (2014.01)
*H03L 7/08* (2006.01)

(52) U.S. Cl.
CPC ...... *H03K 5/14* (2013.01); *H03L 7/08* (2013.01)

(58) Field of Classification Search
USPC .......... 327/231, 235, 355, 356, 361, 291, 327/293–294, 298, 299
See application file for complete search history.

(56) References Cited

U.S. PATENT DOCUMENTS

| 7,912,167 | B2 * | 3/2011 | Saeki ............... 375/355 |
| 8,018,265 | B1 * | 9/2011 | Kim et al. .......... 327/231 |
| 2013/0165132 | A1 * | 6/2013 | Goedken et al. ..... 455/450 |

* cited by examiner

*Primary Examiner* — An Luu
(74) *Attorney, Agent, or Firm* — Blakely, Sokoloff, Taylor & Zafman LLP

(57) ABSTRACT

A delay line has at least four delay stages coupled together in a series, two multiplexers, and a phase interpolator. The first multiplexer has a first input coupled to an output of the first delay stage, and a second input coupled to an output of the third delay stage. Similarly, the second multiplexer has a first input coupled to an output of the second delay stage, and a second input coupled to an output of the fourth delay stage. The phase interpolator is coupled to outputs of the first and second multiplexers, and has an output.

9 Claims, 7 Drawing Sheets

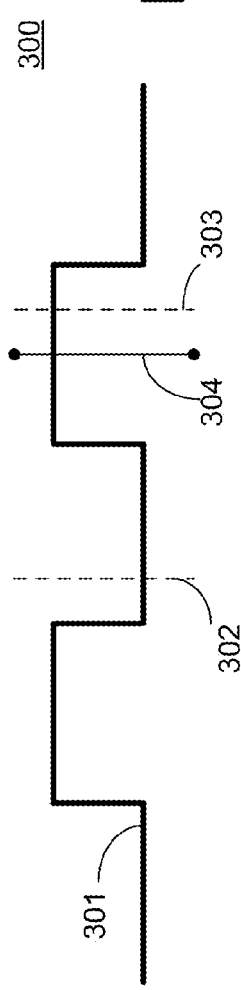
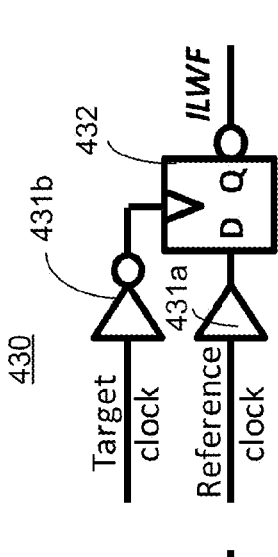
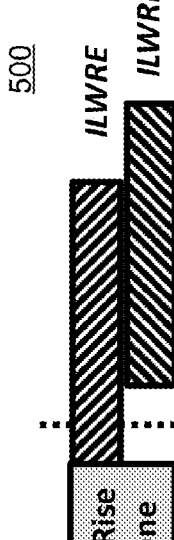
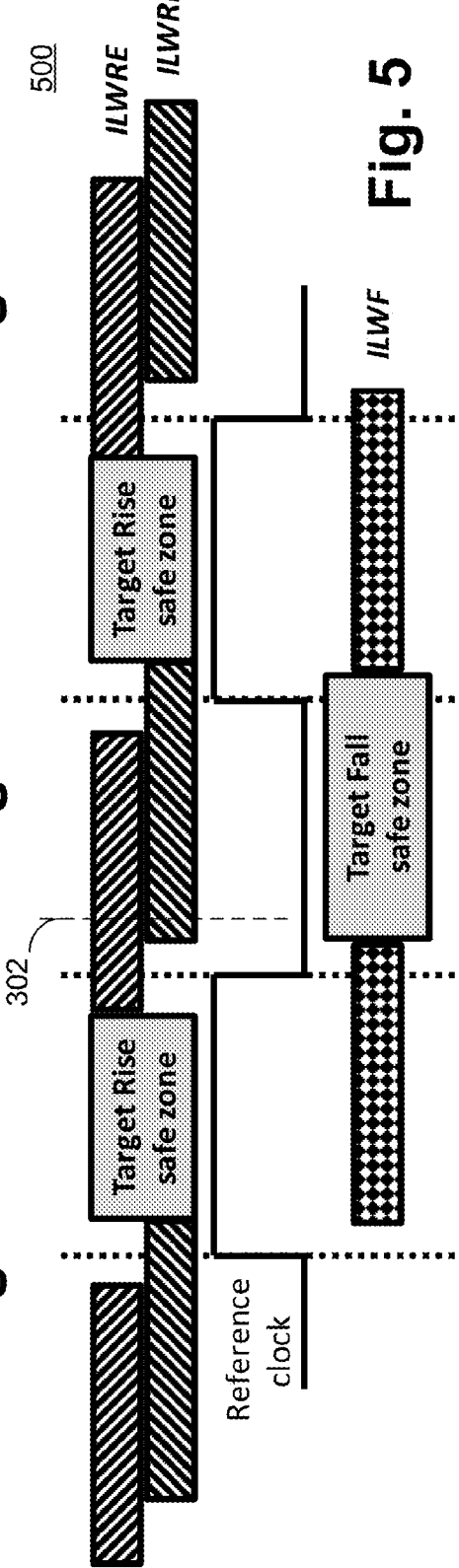

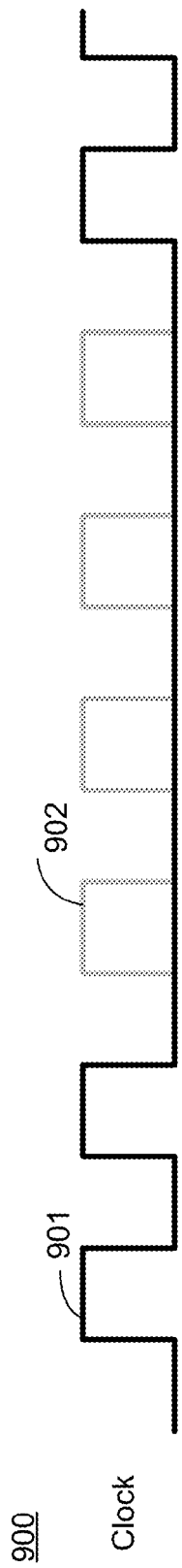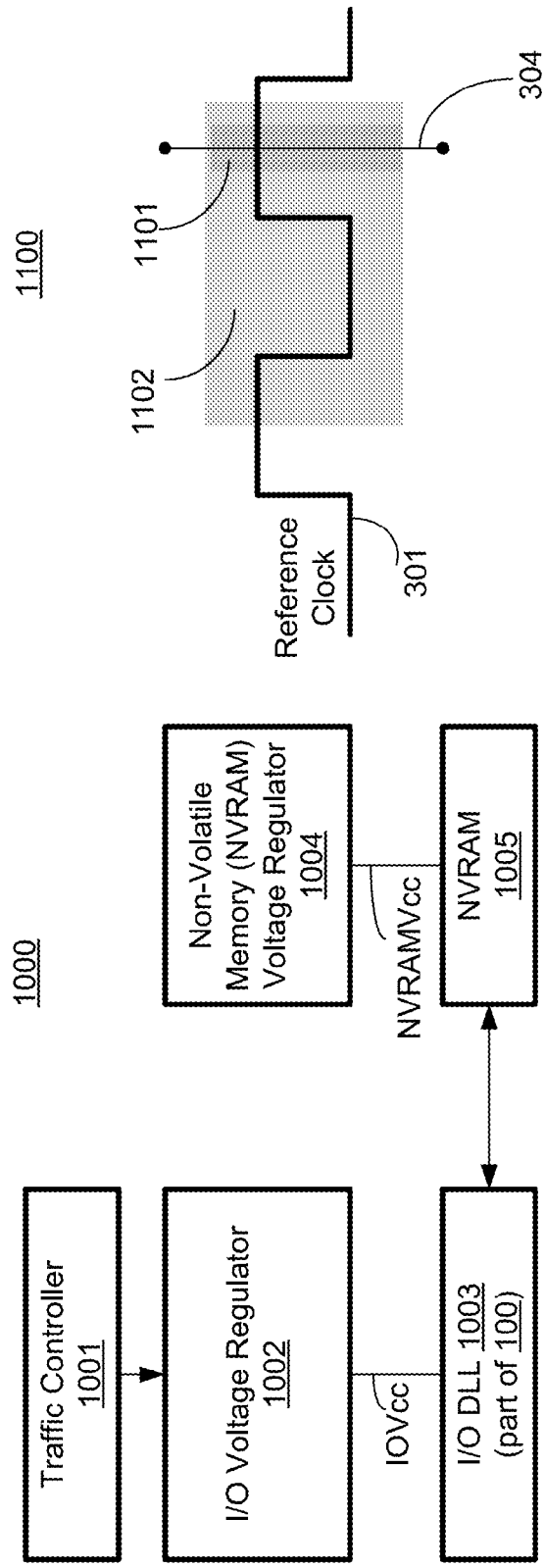

APPARATUS FOR A MONOTONIC DELAY LINE, METHOD FOR FAST LOCKING OF A DIGITAL DLL WITH CLOCK STOP/START TOLERANCE, APPARATUS AND METHOD FOR ROBUST CLOCK EDGE PLACEMENT, AND APPARATUS AND METHOD FOR CLOCK OFFSET TUNING

BACKGROUND

In an I/O (input-output) system with a forwarded clock architecture, there is a need for an apparatus at the receive side to measure and adjust the placement of a clock edge in time very precisely relative to other edges under any environmental conditions that a computer system would normally be exposed to. Due to very strict requirements in-particular for high-frequency operation for such an apparatus, the placement of the clock must be very precise relative to an ideal location. The finer the control the apparatus has over the placement of the clock, the higher the data transfer rates that can be achieved. In addition to very fine steps, the apparatus must also be able to have a very wide range of control to account for manufacturing tolerances, device performance, and environmental conditions. Environmental conditions also change while data is being transferred. So, the apparatus should be able to continuously update the clock placement while not interfering with data transfers.

Analog delay locked loops (DLLs) or other analog based clock placement schemes have historically performed the clock placement task by locking on to the cycle time of an incoming clock and providing various choices for clock placement. However, analog DLLs typically consume higher power and may not be suitable for low power applications. Analog DLLs also often suffer from slow start and re-start issues. Delay lines in DLLs also commonly suffer from non-monotonic delay steps that may cause the clock edge to be misaligned relative to data resulting in incorrect sampling of data by the clock edge.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3 illustrates a waveform with two indefinite/possible starting points for receive clock edge placement and lock target point.

FIGS. 4A-C illustrate sensors/detectors for detecting conditions for placing a clock edge in a safe zone of a Reference Clock, according to one embodiment of the disclosure.

FIG. 5 illustrates protection zones offered by sensors/detectors of FIGS. 4A-C, according to one embodiment of the disclosure.

FIG. 9 illustrates a plot showing a clock waveform with halted period.

FIG. 10 illustrates an apparatus for warm lock of DLL, according to one embodiment of the disclosure.

FIG. 11 illustrates a clock waveform with search area of a cold lock of the DLL vs. a warm lock of the DLL, according to one embodiment of the disclosure.

DETAILED DESCRIPTION

Figure 1:
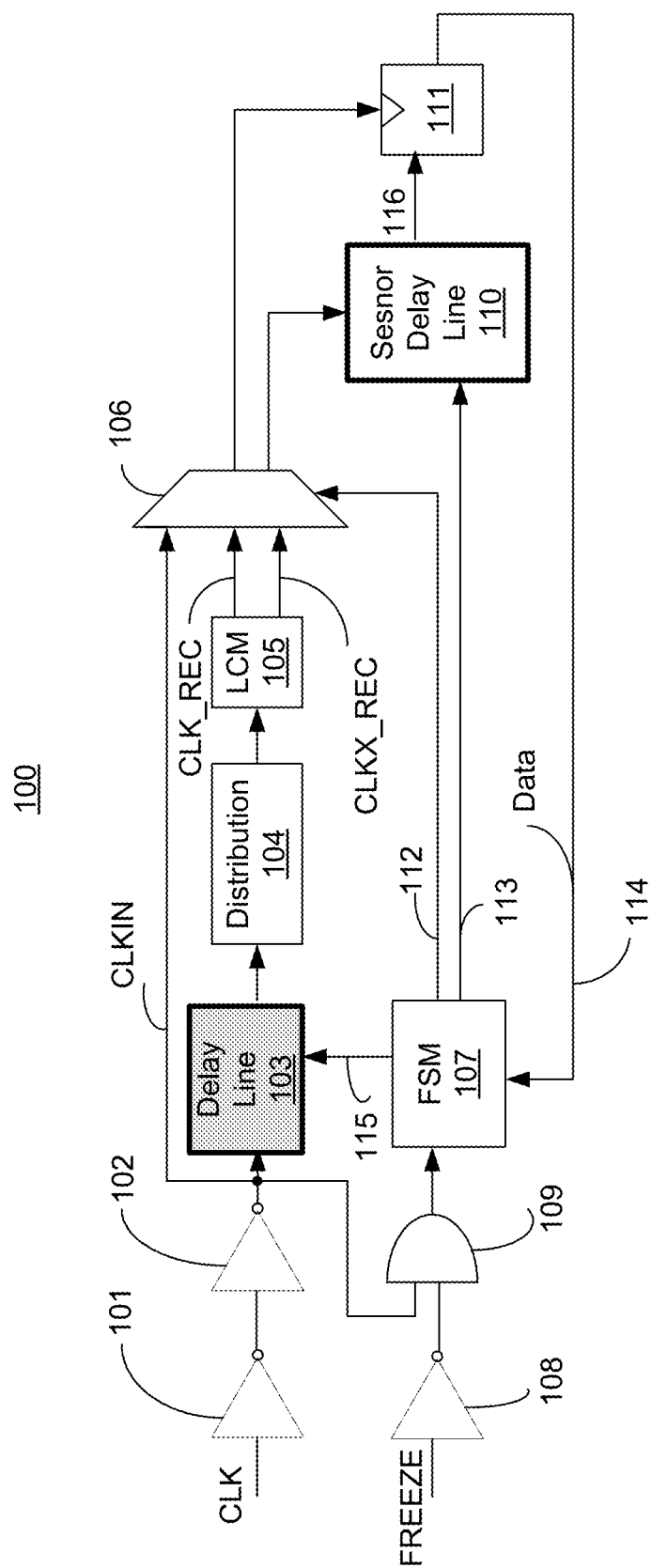
FIG. 1 illustrates a clock placement architecture using monotonic delay line, according to one embodiment of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and the include plural references. The meaning of in includes "in" and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates a n-type transistor (e.g., NMOS, NPN BJT, etc.) and the term "MP" indicates a p-type transistor (e.g., PMOS, PNP BJT, etc.).

FIG. 1 illustrates a clock placement architecture 100 using monotonic delay line, according to one embodiment of the disclosure. In one embodiment, clock placement engine 100 includes clock inverters 101 and 102, main Delay Line 103, signal Distribution network 104, Local Clock Macros (LCM) 105, Multiplexer 106, Finite State Machine (FSM) 107, inverter 108, logic gate 109, Sensor Delay Line 110, and sampler 111.

In one embodiment, input clock CLK is received by inverter 101. In one embodiment, inverter 101 provides an inverted version of input CLK to inverter 102. Here, output of inverter 102 is the received clock signal CLKIN. In one embodiment, received clock signal CLKIN is received as input by Multiplexer 106, main Delay Line 103, and Logic gate 109.

In one embodiment, main Delay Line 103 is operable provide monotonic delay steps to perform clock edge placement and duty cycle correction with minimum insertion delay. In one embodiment, Multiplexer 106, Sensor Delay Line 110, and Sampler 111 form one or more instances of a measurement delay structure to respectively monitor the duty cycle of the recovered clock signal CLK_REC and to monitor the placement/timing of rising/falling edges of the recovered clock signal CLK_REC with respect to the received clock signal CLKIN. In one embodiment, FSM 107 is operable to process the outputs of the two instances of the measurement delay structures.

In one embodiment, main Delay Line 103 receives as input the received clock signal CLKIN from receiver inverter 102 and outputs the recovered clock signal CLK_REC. In one embodiment, Delay Line 103 inserts a monotonic time delay into the recovered clock signal CLK_REC. One embodiment of Delay Line 103 is described with reference to FIG. 2.

Referring back to FIG. 1, in one embodiment, Delay Line 103 is responsive to two different digital control words that control the rising and falling insertion delays independently. While a single Delay Line 103 is shown, in one embodiment, two instances of Delay Line are used to control rising and falling edges, respectively i.e., Rising Delay Line and Falling Delay Line. In one embodiment, FSM 107 is coupled to Delay Line 103 to provide the control words or other code, via one or more lines 115. In one embodiment, Delay Line 103 is responsive to the control words to change/select its delay value, which is usable by Delay Line 103 to adjust the timing of at least one edge of the recovered clock signal CLK_REC in a monotonic fashion. In such an embodiment, via the use of the control words provided to Delay Line 103, FSM 107 is able monotonically increase/decrease/change the rising/falling insertion delays introduced by Delay Line 103 into the recovered clock signal CLK_REC so as to control the edge placement and/or duty cycle of the recovered clock signal CLK_REC.

In one embodiment, an output terminal of Delay Line 103 can be coupled to an input terminal of Distribution network 104. An output terminal of Distribution network 104 may in turn be coupled to an input terminal of Local Clock Macro (LCM) 105. In one embodiment, Distribution network 104 is to route the clock to a plurality of data bits up to a value of N, where 'N' is an integer. In one embodiment, Distribution network 104 receives a single clock, and through a series of tuned wire segments and circuits, spreads that clock over a distance to arrive at a set of data receivers all at substantially (or exactly) the same time. At the data receivers, Local Clock Macros (LCMs), for example 105, receive the clock. In one embodiment, LCMs 105 change the clock from a single-ended signal, to a differential pair called recovered clock signal CLK_REC and its inverse/complement CLKX_REC. CLK_REC may also be referred to in this document as the target clock.

In one embodiment, clocks signals CLK_REC, CLKX_REC, CLKIN, and the inverse/complement of CLKIN may in turn be provided as inputs to Multiplexer(s) 106 of both instances of the measurement delay structure. In one embodiment, Multiplexer(s) 106 may in turn be coupled to FSM 107 to receive selection input signals via one or more lines 112.

In one embodiment, Sensor Delay Line 110 of the two instances of the measurement delay structure is coupled to FSM 107 to receive a code or other instruction via one or more lines 113. Such code from FSM 107 instructs Sensor Delay Line 110 to adjust its delay value that is usable for purposes of adjusting the duty cycle and/or placement of the recovered clock signal. In one embodiment, Sensor Delay Line 110 is also operable to adjust its delay monotonically.

In one embodiment, Sampler 111 or latch circuit receives input 116 from Sensor Delay Line 110 and has its output terminal (which provides the output Data) coupled to an input terminal of FSM 107 via one or more lines 114. In such an embodiment, FSM 107 is able to determine the edge placement and/or values of high/low times of the recovered clock signal CLK_REC and/or CLKX_REC with respect to CLKIN or a self-reference, polarity of the samples, etc. based on the sample data value in the output Data. According to one embodiment, FSM 107 may differentially filter the samples from the two measurement delay structures so that placement samples have less filtering (faster response) than the duty cycle samples of the recovered clock signal CLK_REC.

In one embodiment, a FREEZE signal may be provided as another input to FSM 107 by way of an inverter/driver 108 and a logic gate (such as an AND gate) 109, which in turn also receives the received clock signal CLKIN as an input. In one embodiment, output terminal of logic gate 109 is coupled to FSM 107. In this embodiment, FSM 107 can be responsive to the FREEZE signal to "freeze" operation. In one embodiment, FREEZE signal can cause FSM 107 to store the codes that have been generated for main Delay Line 103 and/or Sensor Delay Line 110 in preparation for a power savings event such as a power down. Thereafter, a quicker restart, from power savings modes where clocks have been halted for arbitrarily long periods of time, can be enabled such that the stored codes are used to expedite the adjustment of the duty cycle and/or placement of the rising/falling edges of the recovered clock signal CLK_REC.

In one embodiment, FREEZE signal can halt the operation of FSM 107 as a power savings measure. Once the clock placement engine has determined the codes for Delay Line 103 and Sensor Delay Line 110, FSM 107 can be frozen to save power and the edge placement remains intact since the delay codes are also frozen. In one embodiment, FREEZE signal can periodically halt the operation of FSM 107. In one embodiment, if clock placement architecture 100 is used to track changes in the recovered clock due to changes in environmental conditions, such as, aging and temperature effects, then it can be frozen and awakened for short intervals. During the short unfrozen interval, clock placement architecture 100 can make the necessary delay line adjustments in Delay Line 103 and Sensor Delay Line 110, and FSM 107 can be frozen again for power savings. According to various embodiments, FSM 107 may selectively update the delay value for Delay Line 103, update the delay value for Sensor Delay Line 110, or hold current delay values. FSM 107 of one embodiment may further run continuously, update periodically, or freeze.

Figure 2:
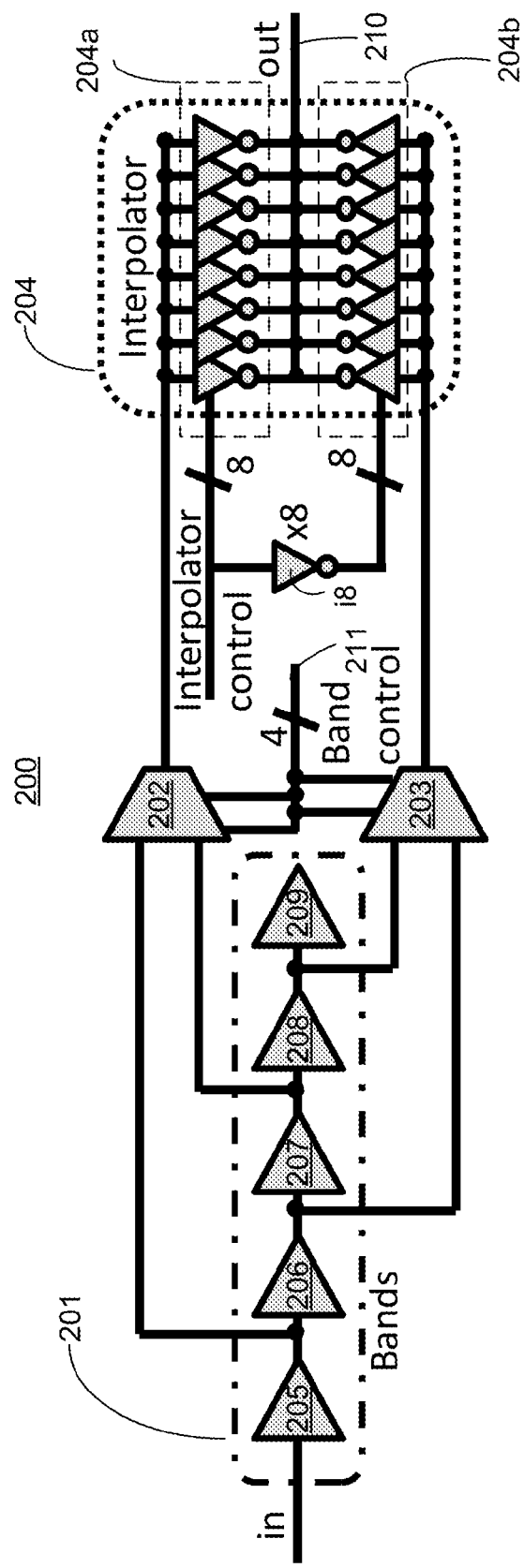
FIG. 2 illustrates a monotonic delay line with phase interpolation, according to one embodiment of the disclosure.

FIG. 2 illustrates a monotonic Delay Line 200 (e.g., Delay Line 103 and/or Sensor Delay Line 110) with phase interpolation, according to one embodiment of the disclosure. It is pointed out that those elements of FIG. 2 having the same reference numbers (or names) as the elements of any other figure can operate or function in any manner similar to that described, but are not limited to such.

In one embodiment, monotonic Delay Line 200 (e.g., Delay Line 103 and/or Sensor Delay Line 110) comprises a delay line 201, multiplexers 202 and 203, phase interpolator (or mixer) 204, and inverter i8. In one embodiment, delay line 201 includes at least four delay stages coupled together in series. In this example, five delay stages are shown—205, 206, 207, 208, and 209. In other embodiments other number of delay stages may be used.

In one embodiment, output of first delay stage 205 and output of third delay stage 207 is received as input by multiplexer 202 (also referred as the first multiplexer). In one embodiment, output of second delay stage 206 and output of fourth delay stage 208 is received as input by multiplexer 203 (also referred as the second multiplexer). In one embodiment, fifth delay stage 209 is coupled to output of fourth delay stage 208 to provide same loading as seen by other delay stages at their respective outputs. In one embodiment, first and second multiplexers 202 and 203 are controlled by band control signal 211. In one embodiment, the band control signal 211 is a four bit signal generated by FSM 107.

In one embodiment, output of first multiplexer 202 is received by a first set of mixers 204a of interpolator 204. In one embodiment, output of second multiplexer 203 is received by a second set of mixers 204b of interpolator 204. In one embodiment, output of each set of mixers from the output "out" 210 of interpolator 204. In one embodiment, first set of mixers 204a is controlled by a digital interpolator control code. In this example, each set of mixers 204a/204b comprises eight mixing elements (e.g., inverters) controllable by an eight bit interpolator control signal. In one embodiment, second set of mixers 204b is controlled by an inverse of digital interpolator control code. Here, the inverse is generated by inverter i8. In this example, for an eight bit interpolator control signal code, eight instances of inverter i8 are used to generate the inverse of digital interpolator control code. Here, band control signal 211 and interpolator control signal are generated by FSM 107 and provided via one or more lines 115.

For a delay locked loop (DLL) to realize a very precise placement of a clock edge for high speed operation, it uses a mechanism that can implement very fine delay steps while also having a very large range to cover any operating condition or manufacturing scenario in which it must operate. Because the precise placement of Target Clock (i.e., CLK_REC) is a temporal operation, in one embodiment, monotonic delay line 200 is used by the DLL. In one embodiment, monotonic delay line 200 is digital in nature and because of this, it maintains its delay whether a clock is propagating through it or not. In one embodiment, monotonic delay line 200 also realizes sub ps (pico second) delay steps for precise clock placement for high speed application. Here, the term DLL refers to clock architecture 100 having the monotonic delay line, FSM, etc.

In one embodiment, monotonic delay line 200 has enough range to accommodate a list of taxes such as manufacturing variations, device aging, end of life guard band, Duty Cycle Distortion (DCD), temperature, etc., as well as having a comfortable search space. For example, the delay line may be described as having a worst case range of well over a clock phase and best case of well over a cycle or more.

In one embodiment, monotonic delay line 200 is capable of having a range well over 300 times the average step size and is architecturally expandable to much more than that as long as the electrical requirements are met. The range can also be architecturally reduced if needed. In one embodiment, the delay steps of monotonic delay line 200 are all monotonic, meaning that successive delays are all positive or negative depending on the direction of the step.

Operation of monotonic delay line 200 is described with reference to bands and interpolator. In one embodiment, the whole delay range of monotonic delay line 200 is accessible with a digital control code (e.g., provided by one or more lines 115 from FSM 107). In one embodiment, a portion of that control code (i.e., band control signal 211) applies to the front stages (i.e., delay stages 205-209 via multiplexers 202 and 203) of monotonic delay line 200 which provide large delay anchor points called bands. In one embodiment, the remainder of the control code (i.e., interpolator control signal) applies to interpolator 204 that provides the very fine steps between each of the bands. In one embodiment, the entire delay range of monotonic delay line 200 can be traversed in very small interpolator steps while transferring seamlessly from band to band. In one embodiment, the monotonicity of Delay Line 200 is preserved independent of the delays and delay differences (whether by design or due to manufacturing variations) of the band stages 205-209.

In one embodiment, bands are made of buffers (e.g., delay stages 205-209) where the delay of each buffer is the delay range of each band. In one embodiment, by adding more bands, the range of monotonic delay line 200 can be increased indefinitely. In one embodiment, all of the bands are always active but only one band can be selected at any given time and the band choice is accomplished using multiplexers 202 and 203 to select which one. In one embodiment, for every additional band that is added a new multiplexer leg is added to monotonic delay line 200.

In one embodiment, the range of monotonic delay line 200 can also be adjusted by tailoring the delay of each buffer or using multiple buffers to suit the application including using different delays for different bands to achieve a desired effect. In one embodiment, interpolator 204 is comprised of two sets (i.e., 204a and 204b) of inverters which all drive the same output "out" 210, but have inputs that differ in time. In one embodiment, the difference in time is set by the band delay and the interpolation is done by slicing that time difference into pieces.

In one embodiment, with the number of time slices dictated by the number of interpolation inverters used (e.g., the number of inverters in each of the two mixer sets 204a and 204b), the time slice and thus delay step size can also be controlled architecturally. While fewer inverters provide for fewer, larger time slices, more inverters provide more, finer time slices. As with the bands, architecturally the number of time slices (which translates to number of delay steps) can be increased indefinitely, according to one embodiment.

In one embodiment, only one multiplexer (from among multiplexers 202 and 203) drives an entire group of inverters of interpolator 204. In such an embodiment, all inverters of interpolator 204 drive the same output node "out." In one embodiment, the control code that is applied to these inverters of interpolator 204 determines how many of one group vs. the other group are turned ON at any given time. In one embodiment, of every pair of inverters of interpolator 204, with the same control bit, only one will be active at any given time because the control is inverted to one of the pair.

For example, first set of mixers 204a receives interpolator control code while second set of mixers 204b receives an inverse of the interpolator control code. In one embodiment, with a control code of all '1s, all of only one group (e.g., 204a) is turned ON and active, and with a control code of all '0s, all of only one group (e.g., 204b) is turned ON and active i.e., just the opposite effect where only the other entire group is turned ON. In one embodiment, any code in between these two values produces a mixture of inverters from one group (e.g., 204a) vying against the other group (e.g., 204b).

In this embodiment of monotonic delay line 200, bands (i.e., delay stages in delay line 201) are shown on the left and the interpolator 204 is shown on the right. So as not to obscure the embodiment, one band 201 (having multiple sub-bands in delay stages) and two sets of interpolators 204a/204b are shown. However, in other embodiments, many more bands and interpolator inverters may be used.

In this embodiment of monotonic delay line 200, three effective bands (a band has an input and output of a buffer so interpolator 204 always has two signals of different delay to interpolate in-between) with four band control signals 211 using two-hot encoding are shown. In one embodiment, each multiplexer 202/203 is akin to two bridge towers with the interpolator always interpolating between those two towers. The bridge analogy is for explaining purposes only. Continuing with the analogy, the bands are like anchor points while the interpolators span the distance like the suspension bridge cables. The length of the bridge, which represents the range in this analogy, could be extended indefinitely by just adding more towers (i.e., bands).

In one embodiment, interpolator 204 has two groups (i.e., 204a/204b) of eight inverters in each for a total of eight logical steps for each band. In one embodiment, FSM 107 (i.e., controller) performs a band switch and then increments the interpolator thermometer code autonomously (without another request) so it ends up with only 8 steps. In one embodiment, the interpolator control signal includes bits which are thermometer encoded with half of the total number of inverters being simultaneously active where the control code chooses between how many from the top group (i.e., 204a) vs. the bottom group (i.e., 204b) are active. In one embodiment, the total number of steps for monotonic delay line 200 is a product of the number of bands and the interpolator steps. In the example, the total number of steps is 3×8=24.

In one embodiment, monotonic delay line 200 can be controlled in any way as long as each multiplexer 202/203 is always passing a signal. In one embodiment, FSM 107 controls monotonic delay line 200 to achieve the monotonic steps. In one embodiment, if the two inputs (i.e., outputs of the two multiplexers 202/203) to the interpolator 204 are not too far apart in time and are switching in the same direction, monotonic steps at out 210 can be achieved.

In one embodiment, continuous delay updates are received and monotonic delay steps across bands are provided while the active clock signal is passing through delay line 201. In such an embodiment, FSM 107 provides control signals to monotonic delay line 200 such that multiplexers switch only between adjacent bands. For example, thermometer code from FSM 107 reverses direction with every adjacent band change. In such an embodiment, FSM 107 causes monotonic delay line 200 to only change bands when the thermometer code is saturated. Table 1 depicts the control code table of monotonic delay line 200. The first column is delay line (DL) step number (i.e., band control signal 211), the second column is the two hot band code, the third column is the interpolator code, the fourth column is intentionally blank, the fifth to seventh columns continue with the DL step number, two hot band code, and interpolator code.

TABLE 1

Illustrates coding of delay line with 24 steps generated by two hot band and thermometer coded interpolator

| DL Step number | Two Hot Band | Interpolator Thermometer Code |
|---|---|---|
| 0 | 0011 | 0000000 |
| 1 | 0011 | 0000001 |
| 2 | 0011 | 0000011 |
| 3 | 0011 | 0000111 |
| 4 | 0011 | 0001111 |
| 5 | 0011 | 0011111 |
| 6 | 0011 | 0111111 |
| 7 | 0011 | 1111111 |
| 8 | 0110 | 1111111 |
| 9 | 0110 | 0111111 |
| 10 | 0110 | 0011111 |
| 11 | 0110 | 0001111 |
| 12 | 0110 | 0000111 |
| 13 | 0110 | 0000011 |
| 14 | 0110 | 0000001 |
| 15 | 0110 | 0000000 |
| 16 | 1100 | 0000000 |
| 17 | 1100 | 0000001 |
| 18 | 1100 | 0000011 |
| 19 | 1100 | 0000111 |
| 20 | 1100 | 0001111 |
| 21 | 1100 | 0011111 |
| 22 | 1100 | 0111111 |
| 23 | 1100 | 1111111 |

In this example, by forcing the thermometer code by FSM 107 to saturate before switching bands, a scenario is established where the band switching is actually hidden from the clock passing through. In one embodiment, when interpolator 204 is saturated, all of the top (i.e., 204a) or bottom (i.e., 204b) set of inverters are turned ON but none of the opposing set is turned ON. In this embodiment, a single signal from delay line 201 is used instead of two. In this setting of monotonic delay line 200, the inputs to the set of interpolator inverters which are turned OFF can be anything and there is no effect on out 210. In the bridge analogy, this is akin to standing on the roadway directly centered on a tower. The two adjacent towers can technically crumble to the ground but the exact spot on the roadway supported by the current tower will remain. Thus, output 210 of the delay line remains stable and unaffected while band switching (adjacent bridge towers) is performed.

In this embodiment, as the control codes from FSM 107 change up to the thermometer code saturation point, the delay step on "out" 210 changes in a monotonic fashion. In one embodiment, at thermometer saturation, the band (i.e., delay stage) is changed to an adjacent one, and the thermometer code reverses with each step producing one more monotonic step. For example, for steps 7 and 8, and steps 15 and 16, the interpolator thermometer code is the same i.e., at step 7 when thermometer code saturated, the next step causes multiplexers 202 and 203 to select the next band. In one embodiment, for further delay progression, the process simply continues to the next band. In one embodiment, because the transition does not adversely affect the signal integrity of the output signal of monotonic delay line 200, this operation can also happen any time an active clock is passing though allowing for continuous updates to monotonic delay line 200 during operation.

FIG. 3 illustrates a plot 300 having a waveform with two indefinite starting points for receive clock edge placement and lock target point, according to one embodiment of the disclosure. The particular starting points 302 and 303 are illustrative only for this disclosure and not the only possible starting points. Waveform 301 is a Reference Clock signal. In this example, the Reference Clock signal is a 50% duty cycle signal and two of its periods are shown. The first dashed line 302 is one possible starting point for the Target Clock edge (or receive clock edge) used for sampling data, such as when the circuitry is first powered ON. The second dashed line 303 is another starting point for the Target Clock edge used for sampling data such as when the circuitry is first powered ON. The large difference in starting locations for the Target Clock edge (i.e., can be due to different clock frequencies, transistor speeds, temperatures, circuit voltages, etc.). The solid line 304 with solid circle endpoints is the lock position for the Target Clock edge. In this example, the lock position is shown as the best place for the target clock to be positioned to best sample incoming data.

The DLL of FIG. 1 directly controls the delay and hence positioning of the Rx (receive) clock (also referred here as the Target Clock) with respect to the incoming Reference Clock 301. Reference Clock 301 is same as CLKIN output from inverter 102 in FIG. 1. Since CLK (input to inverter 101) is an input to the Silicon die, it, as well as the accompanying data, may have special receiver circuits. In one embodiment, inverters 101 and 102 are designed to match the data lane delays as closely as possible. Because the associated data is aligned with the Reference Clock, the Rx clock's correct final positioning (i.e., lock target at position 304) with respect to the Reference Clock 301 is one of the goals.

When a die or chip is manufactured, variations in the fabrication of the transistors and other elements on the die lead to differences in the speed at which those devices may operate. While there is a normal distribution to the variability, sometimes an entire wafer may tend to be fabricated with generally slow or fast devices. Or it may be decided after the design phase to intentionally fabricate devices that are naturally slower or faster than what was understood as the typical speed. It is generally the job of a designer to make sure that the circuits on the chip perform correctly no matter how fast or slow the transistors perform as long as they're within a pre-understood statistical range.

When the DLL is powered ON, it has a digital delay line (e.g., monotonic Delay Line 103 or 200) that is programmed to a certain numeric value for its delay. As discussed above, DLL is comprises of substantially all blocks of FIG. 1. Sometimes, Distribution 104 may be excluded from the DLL description because it may be physically large compared to other blocks in FIG. 1 but its inclusion in the clock system, that the DLL is part of, may be required. That actual delay at power up time may not be known, only the delay code may be known. Because the actual delay may not be known, in one embodiment, FSM 107 figures out where the current position of Rx clock is and then decides which direction (more or less delay) the Rx clock (and thus its edge) should move to reach the correct position for high speed data transfer.

The correct direction of moving Rx Clock (i.e., Target Clock) is important because moving in the wrong direction may lead to incorrect positioning resulting in no successful data transfer. For example, for a delay chain which is too long and sensitive to voltage fluctuations, the movement of Rx Clock in the wrong direction may result in intervals of corrupted data transfers. In one embodiment, clock architecture 100 is designed so that Rx clock is locked to the earliest possible phase of received Reference Clock CLK. In such an embodiment, power savings and jitter benefits are achieved. In systems with free running clocks, in one embodiment, the clock path is kept as short as possible, analogous to locking at the earliest phase, to realize the lowest or reduced jitter.

Plot 300 shows an example of Reference Clock 301 and two of the possible starting points at which the Rx clock can be positioned on startup. Here, position 304 indicates the target locking position for the Rx clock. In the two particular startup cases shown (labeled as 302 and 303), the DLL of FIG. 1 decides to move in different directions depending on whether the starting position is earlier (left: case 302) or later (right: case 303) than the lock target position 304.

In one embodiment, DLL of FIG. 1 is used with a deterministic I/O system with a forwarded valid lane. In such an embodiment, overall clock delays are kept short, and Rx clock is positioned in the correct phase (even or odd) relative to the data and a received valid signal. In one embodiment, the clock architecture 100 has sensors that indicate which way FSM 107 should cause the Target Clock (i.e., Rx Clock) delay to move. These sensors cause FSM 107 to adjust Rx Clock delay in the correct Reference Clock phase.

FIGS. 4A-C illustrates sensors/detectors 400, 420, and 430 for detecting conditions for placing a clock edge in a safe zone of a Reference Clock, according to one embodiment of the disclosure. It is pointed out that those elements of FIGS. 4A-C having the same reference numbers (or names) as the elements of any other figure can operate or function in any manner similar to that described, but are not limited to such.

Sensors 400, 420, and 430 together are responsible for detection of incorrect Rx clock placement in multiple overlapping sections of time at the macro scale. The placement sensor, comprised of 106, 110, and 111, measures and determines the fine clock placement, but may need macro protection from largely misplaced clock edges which can confuse it. In one embodiment, FSM 107 has logic to interpret the responses of Sensors 400, 420, and 430 and to cause Rx Clock to move accordingly.

In one embodiment, Sensor 400 comprises buffer 401 and sampler 402. In one embodiment, sampler 402 is a flip-flop. In one embodiment, Target Clock is buffered by buffer 401 and used as clock for sampler 402. In one embodiment, Reference Clock (e.g., 301) is received as data 'D' by sampler 402. In this embodiment, output 'Q' of sampler 402 is ILWRE.

Here, "ILW" stands for In Lock Window and signifies that, when asserted, the sensor believes that the Target Clock is positioned safely in the correct target phase such that the placement sensor will signal properly and not be confused. Placement sensor is the measurement delay structure comprising Multiplexer 106, Sensor Delay Line 110, and Sampler 111 of FIG. 1. Here, 'R' and 'F' stand for Rise and Fall, respectively, and signify the edge of the Target Clock that is being protected and used for triggering the circuit. Here, 'E' and 'L' stand for Early and Late, respectively, and signify the time shift in protection that the particular circuit covers.

In one embodiment, sensor 420 comprises buffer 421 and sampler 422. In one embodiment, sampler 422 is a flip-flop. In one embodiment, Target Clock is used as clock by sampler 422. In one embodiment, Reference Clock (e.g., 301) is buffered by buffer 421 and then the buffered version is received as data 'D' by sampler 422. In this embodiment, output 'Q' of sampler 422 is ILWRL.

In one embodiment, Sensor 430 comprises buffer 431a, inverter 431b, and sampler 432. In one embodiment, sampler 432 is a flip-flop. In one embodiment, Target Clock is inverted by inverter 431b and then used as clock for sampler 432. In one embodiment, Reference Clock (e.g., 301) is buffered by buffer 431a and then the buffered version is received as data 'D' by sampler 432. In one embodiment, buffer 431a has more delay than the delay of inverter 431b. In this embodiment, output 'Q' of sampler is ILWF. Each detector (400, 420, and 430) covers a portion of a danger zone that can confuse the placement sensor and together, provide a continuous overlapping protection scheme that a single sensor circuit could not do solo.

FIG. 5 illustrates protection zones 500 offered by sensors/detectors of FIGS. 4A-C, according to one embodiment of the disclosure. It is pointed out that those elements of FIG. 5 having the same reference numbers (or names) as the elements of any other figure can operate or function in any manner similar to that described, but are not limited to such.

In one embodiment, zones of protection 500 are the rectangular regions with patterns that each ILW provides. The zones of protection 500 may also overlap. In one embodiment, protection zone provided by ILWRE overlaps with protection zone provided by ILWRL.

In one embodiment, when all three Sensors (i.e., 400, 420, and 430) assert, meaning that the Target Clock is "In the Lock Window" does the DLL honor inputs from the placement sensor. In such an embodiment, the rising and falling edges of the Target Clock are simultaneously in the Rise and Fall safe zones, respectively. The safe zones are shown by the shaded regions. In one embodiment, if any ILW is de-asserted, that's an indication that the Target Clock is not in a safe zone and its placement may confuse the placement sensor and FSM 107 may respond by taking large forward steps (moving the Target Clock later) until all ILWs are asserted.

As an example, referring back to FIG. 3, because the lock target position is in the "high phase" of the clock, that is the only phase that is correct. Here, the starting scenario 302 has the Rx clock's rising edge positioned in the "low phase" of the Reference Clock 301. In this case, sensor 400 de-asserts ILWRE to indicate an unsafe position. Depending on the circuit design of sensor 420 that generates ILWRL, sensor 420 may also signal danger. For example when Target Clock edge is at position 302, then sensor 420 indicates that the Target Clock edge is in a danger zone shown by the patterned region. In this example, Target Clock edge position 302 is near the edge of the danger zone. If delay of buffer 421 is adjusted (by design or due to manufacturing variations), sensor 420 may miss identification of Target Clock edge position 302. Adjusting buffer delay of buffer 401 for sensor 400 may not cause sensor 400 to not signal danger for Target Clock edge position 302 due to the architecture of the design. This is another example of how and why overlapping protections zones are used. In this example, output ILWF of sensor 430 may also signal danger when detecting the location of the falling edge of the Target Clock, but it would be dependent on the duty cycle of the Target clock.

Target edge position 302 shows where the rising edge is. In this example, falling edge of Target Clock is not shown. The Falling edge is controlled indirectly by moving rising and falling edges together (as a result of trying to place the rising edge correctly), or independently to adjust Duty Cycle (Duty Cycle Adjustment only, ever, moves the falling edge). In one embodiment, rising edge of Target Clock is the only edge that the placement sensor ever measures. In this example, ILW sensors (400, 420, and 430) assert in agreement, and the DLL's normal placement sensor will work as expected.

In one embodiment, there are five signals that DLL 100 (same as clock architecture 100) uses for sensing and to know what to do with the Target Clock. These five signals include data signal 114 for placement sensor (QLS) (described with reference to FIG. 13), data signal 114 for duty cycle sensor (not shown), ILWRE signal from sensor 400, ILWRL signal from sensor 420, and ILWF signal from sensor 430. In one embodiment, DLL 100 uses data signal 114 for fine or precise movement of target clock edge. In one embodiment, DLL uses ILWRE, ILWRL, and ILWF signals for coarse location detection and movement of target clock edge by adding large amounts of delay to target clock edge until the ILWs agree that the Target Clock edge is now in a safe zone.

Figure 6:
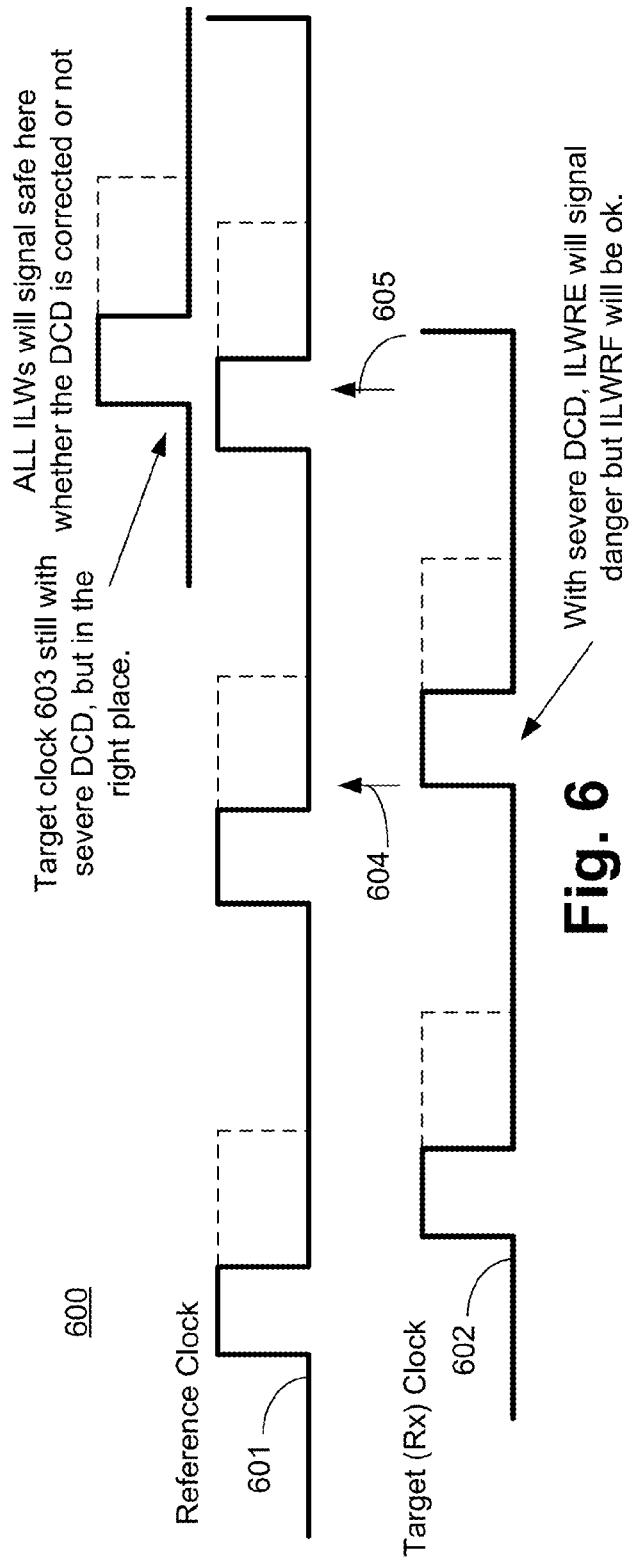
FIG. 6 illustrates a plot with two waveforms with Duty Cycle Distortions, one being the Reference Clock and the other the Target Clock, with Duty Cycle Distortion.

One reason for having ILWF is due to a condition described with reference to FIG. 6. FIG. 6 shows Reference Clock and Target Clock signals with Duty Cycle Distortion. For example, Duty Cycle may be distorted such that the rising and falling edges fit into the "Target Rise safe zone" of FIG. 5. So just having ILWRE and ILWRF may not be sufficient because the placement sensor may still be confused because of the way it detects edge placement. Thus, the use for a circuit to detect the "falling" clock edge placement as embodied in the ILWF detector.

FIG. 6 illustrates a plot 600 with two waveforms, one being the Reference Clock and the other the Target Clock, with Duty Cycle Distortion. In addition to unknown start up Target Clock edge placement, other circumstances can also lead to confusion of the placement sensor. Manufacturing variations or other circumstances can cause the various clocks being measured in the DLL to have a Duty Cycle which is distorted. Duty Cycle Distortion, as referred to here, is the difference of time that a clock signal is high vs. low. The resulting high or low time of the clock being of a smaller duration than ideal leads to the possibility of placement sensor confusion and incorrect movement requests. Plot 600 shows two waveforms 601 and 602. Waveform 601 is the Reference Clock and waveform 602 is the Target Clock. Here, the solid lines of Reference Clock and Target Clock shows clocks with severe Duty Cycle Distortion (DCD) contrasted with dotted lines depicting a clock with no DCD.

An issue comes to play when the DCD coupled with a startup placement of Target Clock edge that causes just one edge of the Target Clock to be in the wrong Reference Clock phase when the other Target Clock edge is actually in the correct Reference Clock phase. The arrow in FIG. 6 indicates the rising edge of the Target Clock and its alignment with the Reference Clock. In the case of no DCD (i.e., dashed lines) the rising edge of Target Clock is in the "high time" of the Reference Clock. In the case of the severe DCD, the arrow points to the "low time" of the Reference Clock.

In one embodiment, DLL FSM 107 automatically starts to correct for Target Clock DCD as soon as the DLL starts up. In one embodiment, the ILWs of FIG. 4 sense when the rising and falling edges of the Target Clock are in places that can confuse the placement sensor. In the case of FIG. 6 with severe DCD, ILWRE signals danger at the arrow 604 and the MDL 200/103 will add delay until arrow moves to the arrow 605. At this point, even with severe DCD, all of the ILWs indicate safe zone because all of the edges are in "safe" zone and the fine placement sensor will operate properly. Waveform 603 is the Target Clock with severe DCD but in the safe zone after delay adjustment. In this case, all ILWs of FIG. 4 signal safe whether DCD is corrected or not. In one embodiment, the DLL is able to perform DCD correction for a fraction of the startup sequence and all placement activities are suspended until this DCD corrective period is complete.

In one embodiment this mode is optional and is only used in cases of DCD even more severe than the extreme cases depicted here.

Figure 7:
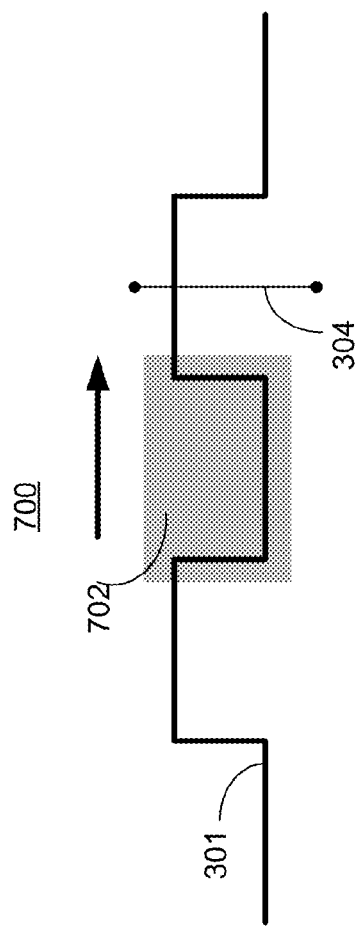
FIG. 7 illustrates a waveform showing rising danger zone (shaded region) and lock target point, according to one embodiment of the disclosure.

FIG. 7 illustrates a plot 700 with waveform 301 showing rising danger zone (shaded region) and lock target point 304. It is pointed out that those elements of FIG. 7 having the same reference numbers (or names) as the elements of any other figure can operate or function in any manner similar to that described, but are not limited to such.

Plot 700 shows the rising danger zone with respect to the Reference Clock which is larger than any single danger detector (from Sensors 400, 420, 430) can cover. The shaded region 702 of FIG. 7 indicates the problem region while safe zones in FIG. 5 indicate the solution regions. To robustly cover the entire sampling range, multiple detectors are used as discussed with reference to FIGS. 4A-C. Each sensor is configured a bit differently and together, their detection capabilities overlap each other to provide complete detection of the dangerous conditions previously described.

Referring back at FIG. 5, ILWRE and ILWRL detectors (i.e., sensors 400 and 420) can be seen as the same logical circuit, but the buffer position has changed. This effectively shifts the detection zone of what the circuit considers safe or not. FIG. 5 shows this with two striped boxes (i.e., ILWRE and ILWRL) on the upper part of the diagram by providing the same detection capabilities, but the two striped boxes are shifted in time with respect to each other creating a larger detection zone than either circuit can cover alone. This combined overlapping effect results in the complete coverage of the gray area in Plot 700 of FIG. 7.

In one embodiment, the DLL uses the concept of "start early/fast, search later/slower," which generally means the monotonic Delay Line 103 starts out with a fast delay which positions the Rx clock edge earlier in time than the final lock position. Search slower generally means that as the DLL searches for the correct placement, the delay of the Rx clock will always increase initially, pushing the clock later in time, until it nears the final target where it will eventually reverse direction to dither/track around the final lock target. This is simplistically shown as a horizontal arrow in plot 700.

In one embodiment, the detectors (i.e., sensors 400, 420, 430) work together to make sure as one detector signals danger, and the others do not because of their limited range, that they hand off the danger signaling one to another as the Rx clock is delayed in time, searching for a safe zone. In such an embodiment, as Rx clock is delayed in time and enters the overlap range of the detectors, it is continuously delayed until all detectors (i.e., 400, 420, and 430) no longer indicate a danger zone. This can be visualized by FIG. 7 and an Rx clock's rising edge that is trying to be repositioned from inside the rising danger zone, shown in gray, to outside of it and toward the lock target position 304.

Figure 8:
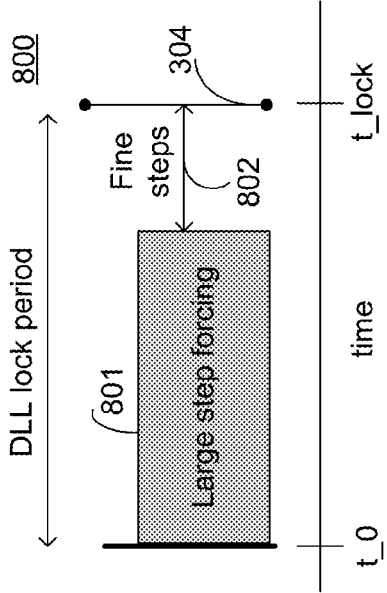
FIG. 8 illustrates a plot showing a method for reducing delay locked loop (DLL) lock time, according to one embodiment of the disclosure.

FIG. 8 illustrates a plot 800 showing a method for reducing delay locked loop (DLL) lock time, according to one embodiment of the disclosure. It is pointed out that those elements of FIG. 8 having the same reference numbers (or names) as the elements of any other figure can operate or function in any manner similar to that described, but are not limited to such.

Due to the "start early/fast, search later/slower" concept of the DLL discussed with reference to FIG. 7, coupled with the very small step sizes the DLL is capable of taking for very fine placement, depending on where the Rx clock is positioned at startup, it could take an extremely large number of steps to reach the final locking target 304. Here, x-axis is time. At time t_0, the DLL is powered up. At time t_lock the DLL locks and places the target edge at a position to correctly sample data. Region 801 is the region in time when DLL takes large step sizes, while region 802 is the region in time when DLL takes smaller step sizes.

To reduce the DLL lock time, a dynamic step size method is used, according to one embodiment. In one embodiment, an apparatus comprises two registers that specify the minimum and maximum size of delay steps. In one embodiment, the dynamic step size method is performed or controlled by FSM 107, the method comprises taking maximum allowable delay step size by the DLL upon startup (e.g., power up). In one embodiment, the maximum allowable delay step size is predetermined by a size stored in one of the two registers. In one embodiment, FSM 107 causes the DLL to continue to take the maximum allowable delay step size to get closer to the target lock point 304 quickly. As an example, if the Target Clock position at startup is represented by 302 in FIG. 3, with a single small step size, it would take DLL 100 much longer to reach the lock position 304 than if the Target Clock had started at the position 303 and was trying to reach the same lock target 304. In one embodiment, FSM 107 causes the DLL to continue to take the maximum allowable delay step size so long as FSM 107 determines that the delay in "out" 210 needs to be increased.

In one embodiment, when FSM 107 determines that it has overshot the target lock point 304, it causes DLL to pull-in/decrease the delay on "out" 210 i.e., take a delay step backwards. In such an embodiment, FSM 107 causes DLL to take a step backwards, and the step size being taken is cut in half. In one embodiment, every further backward step cuts the step size in half again until the minimum step size is reached. During this iteration, FSM 107 compares the step size with the minimum step size stored in one of the two registers. The method of the embodiment described here ensures that the maximum step size is taken until the DLL has stepped past the lock target point 304 which means that it is now relatively close to locking and extremely large steps (e.g., 801) are not needed anymore.

In one example, despite the lock target proximity, the step size is not immediately reduced to the minimum value stored in one of the two registers because the distance to the lock target 304 can still be the majority of the maximum step size stored in one of the two registers. This maximum step size can be a rather large delay value, so the step size is reduced gradually to ensure the lock target is reached in the shortest amount of time, according to one embodiment. In one embodiment, the minimum step size stored in one of two registers is reached because DLL 100 will dither/track around the lock target 304. In such an embodiment, DLL 100 reaches the lock target position 304 in the fastest method possible using this dynamic step size algorithm.

In one embodiment, FSM 107 forces maximum step sizes for the first period (e.g., 10% to 30%) of the lock time. In the absence of this embodiment, if the DLL steps backwards a few times at startup and reduces its step size to minimum, it may not be able to traverse the delay required, in the time required, to achieve lock with the fine steps. At power on, the placement sensors (grouping of various blocks in DLL 100) are beginning to calibrate themselves, but before completion, they may send brief requests to FSM 107 via data signals 114 that incorrectly request a backwards delay step from Delay Line 103. This is a transient condition, but is part of powering up. In one embodiment, forcing large steps for the early stages of startup ensures that the dynamic step size function is not defeated before its intended usage. In one embodiment, even when DLL 100 reaches near the lock target very fast and is stepping forward and backward around the lock target with large steps, this maximum step forcing period 801 lasts for a portion of the lock time. In one embodiment, when the large step forcing period 801 expires, FSM 107 reduces the step size (as shown by region 802) with each backward step, eventually reaching the minimum allowed step size and fine lock placement can be achieved.

In one embodiment, clock placement engine (part of clock architecture 100) is operable to tolerate instant starting and stopping of clocks without losing placement of Rx Clock. In one embodiment, clock architecture 100 includes a digital DLL that has the ability to tolerate the fast and frequent stopping and starting of the forwarded clocks.

In one embodiment, the power of a chip is reduced by keeping the I/Os powered ON when data transfers are required (i.e., sending and receiving data) otherwise turn them OFF. In one embodiment, the I/O is turned ON a few clock cycles before data is received, and is turned OFF one or few clock cycles after data is received and no foreseeable data is expected. In such an embodiment, the clocks are starting and stopping very aggressively according to data transfers.

In one embodiment, Tx (Transmit) side of an I/O knows when to start and stop the clock since it is the instigator, but on the Rx (receive) side of the I/O, the forwarded clock may just start toggling after an unknown duration of not toggling and the Rx circuits must receive data at full speed with no errors. In one embodiment, clocks are positioned correctly when data transfers start. DLL 100 may not adjust Target Clock edge instantly upon clock restart, but data transfers start immediately and must be error free.

In one embodiment, delay lines (e.g., monotonic Delay Line 103, 200) are all digital, with no bias currents, or long analog integration circuits, or closed oscillation loops. In such an embodiment, the delay lines can hold their delay indefinitely as long as their delay code does not change even if the clock through them stops. In one embodiment, the clock (CLK) that propagates through the delay line is also the same clock that operates FSM 107 for the DLL. In one embodiment, this clock is the forwarded clock. In one embodiment, when the forwarded clock is stopped, FSM 107 also stops and the whole DLL 100 is frozen. In such an embodiment, delay lines remain intact with frozen delay codes (i.e., band control 211 and interpolator control codes are frozen). In one embodiment, when the forwarded clock resumes toggling, the DLL is able to start adjusting again to fine tune the position of the clock placement. FIG. 9 illustrates a plot 900 showing a clock waveform 901 with halted period 902.

Because the duration that clock 900 is halted is unknown to a receiver and thus the DLL, environmental conditions (such as temperature, power supply voltage, etc.) may have changed significantly since the last time the DLL was adjusted. Because the delay of FETs is temperature dependent, significant temperature changes between when the clock stopped and restarted could cause the actual delay in the delay lines to be inadequate for proper high speed data reception. That is, the clock may have been placed correctly when it stopped toggling, but upon restart, it is not positioned correctly, e.g., it could be placed too early or late relative to ideal, and data reception is now compromised.

In one embodiment, a method is provided to protect against severe environmental changes by periodically adjusting (i.e., retraining) clock positioning regardless of data transfer requirements. In one embodiment, the interval and duration of the retraining sequences is programmed such that any additional power consumption is negligible.

As an example, temperature will be used again, but this applies to any effect with a sufficiently long time constant. Maximum temperature change rates in general do not exceed 100° C. per second on silicon. That translates to 1 degree C. per 10 mS, which is an interval that is very aggressive since a 1 degree temperature change has a nearly immeasurable effect on the delay of a FET. Nevertheless, for describing the embodiment, if retraining of clock happens once every 10 mS, for example, and the duration of that re-training event is 1 µs, for example, (which is also much longer than the DLL needs to adjust for the effects of a 1 degree temperature change), that's a power usage of 0.01%, for example, of the full on power of the DLL. Since full DLL power is measured in mW, 0.01% may be measured in µW or nW and is negligible. In one embodiment, by performing periodic training at specific intervals, the time since the last training is always less than or equal to the programmed interval, thus ensuring correct positioning for any incoming data.

As an example, if the retraining interval is 10 ms and that has been determined to be an adequate interval for mitigating environmental impact on performance, 10 mS will be the longest period the clock may ever be stopped. If there are data transfers that force the clock to restart before the 10 mS is expired, the extra clock toggling sequences may be used as additional retraining opportunities for the DLL. Thus, in this example, the retraining interval may be 10 mS worst case, but could be any value less than 10 mS subject to data requirements restarting the clock.

FIG. 10 illustrates an apparatus 1000 for warm lock of DLL, according to one embodiment of the disclosure. It is pointed out that those elements of FIG. 10 having the same reference numbers (or names) as the elements of any other figure can operate or function in any manner similar to that described, but are not limited to such.

In one embodiment, apparatus 1000 comprises a Traffic Controller 1001, I/O Voltage Regulator (VR) 1002, I/O DLL 1003 (which may be part of clock architecture 100), Non-Volatile Memory (NVRAM) VR 1004, and NVRAM 1005. In one embodiment, Traffic Controller 1001 is an operating system.

In one embodiment, I/O DLL (DLL) 1003 tolerates aggressive power savings measures with low startup latency. During brief periods of data inactivity, the clock to DLL 1003 will stop as previously discussed. During durations that are longer (e.g., by a predetermined or programmable amount), Traffic Controller 1001 decides to shut down the I/O system even to the extent of removing power, for even more savings. These events can occur well below the sub 100 µs level.

In one embodiment, Traffic Controller 1001 understands that there is a startup latency associated with re-powering on the I/O system, but performance demands require that this latency be kept to much less time than the time it takes to cold boot. Cold boot in this context can be described as an initial power on condition for the I/O system receiving power from I/O VR 1002 having never received power before and/or with no prior stored history i.e., starting the locking sequence for DLL 1003 from the start or during a cold boot with no history. Conversely, warm lock is the process of locking DLL 1003 according to previously saved data associated with the previously locked DLL. In one embodiment, DLL 1003 is not cold locked, which can take several is to complete, but instead DLL 1003 employs warm lock. In one embodiment, warm lock sequence has a prerequisite of a single cold lock sequence, but the cold lock does not need to immediately precede the warm lock.

In one embodiment, FSM 107 performs cold lock sequence on DLL 1003 for finding the correct locking position at power on with no other data available. During normal operation, I/O system and DLL 1003 run for an indeterminate amount of time. At any time Traffic Controller 1001 may decide to shut down the power to the I/O system. For example, in one embodiment, Traffic Controller 1001 instructs I/O VR 1002 to stop the supply of IOVcc to I/O DLL 1003.

Generally, turning OFF the power to DLL 1003 at any time results in all local delay line settings being lost. In one embodiment, prior to turning OFF DLL 1003, FSM 107 periodically and autonomously saves DLL 1003 locking condition to NVRAM 1005. Here, locking condition may include digital codes for interpolator 204 and band control signal 211. In general all delay codes for Delay Line 103 and Sensor Delay Lines 110 and other necessary FSM information may be stored to NVRAM 1005. In another embodiment, FSM 107 saves the setting of DLL 1003 in response to a trigger instead of continuously updating NVRAM 1005 with locking condition. For example, FSM 107 saves locking condition of DLL 1003 into NVRAM 1005 when a shutdown sequence begins as indicated by Traffic Controller 1001 i.e., FSM 107 saves locking condition of DLL 1003 into NVRAM 1005 before DLL 1003 is powered down. In one embodiment NVRAM 1005 is powered by NVRAM VR 1004 which provides constant NVRAMVcc to NVRAM 1005 even after I/O VR 1002 has shut down the I/O system and I/O DLL 1003. In one embodiment, NVRAM 1005 keeps its contents saved even when NVRAM VR 1004 shuts down the supply to NVRAMVcc.

In one embodiment, when the I/O system's power is restored after another amount of time controlled by the Traffic Controller 1001, FSM 107 directs DLL 1003 to execute warm lock. As part of that procedure, in one embodiment, the previous delay line settings are retrieved from NVRAM 1005 and loaded back into registers where they resided prior to the power down event.

FIG. 11 illustrates a plot 1100 with clock waveform 301 with search area of a cold lock of the DLL vs. a warm lock of the DLL, according to one embodiment. It is pointed out that those elements of FIG. 11 having the same reference numbers (or names) as the elements of any other figure can operate or function in any manner similar to that described, but are not limited to such.

Plot 1100 with clock waveform 301 shows potential search area of a cold lock (lightly shaded region 1102) compared to that of a warm lock (dark shaded region 1101). The warm lock region is substantially close to target lock point 304. During a power down event, which has an indeterminate length and can last sub mS to years, the environmental conditions, such as temperature, may have changed. In one embodiment, the delay change in Rx Clock through the clock path associated with the environmental changes is bounded by calculations compounding the worst case environmental and electrical changes accumulated over the worst case time interval I/O VR 1002 could have been OFF and used as the maximum amount of adjustment the DLL may need to perform during warm lock procedure. In one embodiment, with the delay change bounding, the DLL searches through a delay range 1101 that is a tiny fraction of the search space 1102 of a cold lock sequence.

In one embodiment, warm lock allows the DLL to lock up to 30-40 times faster than a cold lock. In such an embodiment, warm lock enables low data startup latencies at re-power on event while enabling deep and frequent power savings events. An example of this, given a very specific set of environmental and startup conditions, is the DLL can take 30,000 clocks for a cold lock sequence. But a warm lock may only need 800 clocks to regain correct placement.

Figure 12:
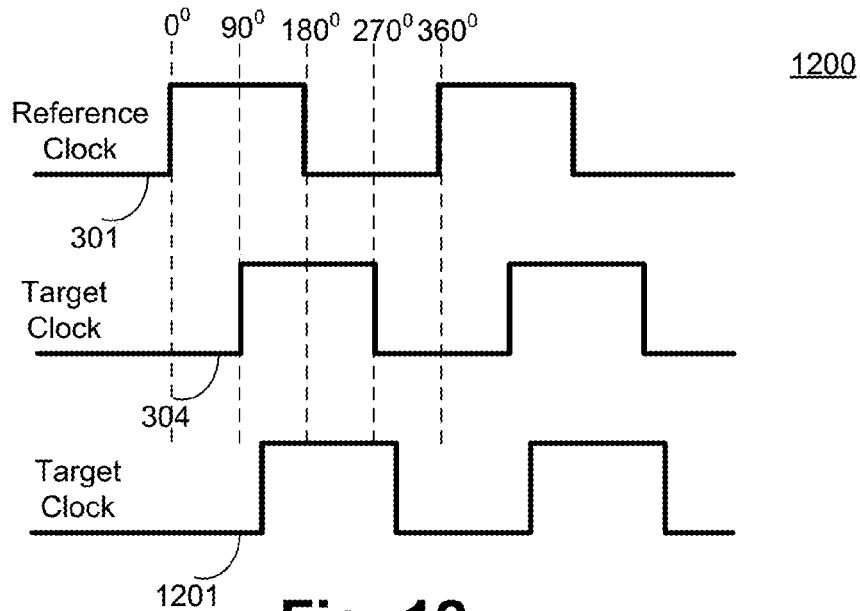
FIG. 12 illustrates a plot with Target Clock relative to Reference Clock.

FIG. 12 illustrates a plot 1200 with Target Clock relative to Reference Clock. It is pointed out that those elements of FIG. 12 having the same reference numbers (or names) as the elements of any other figure can operate or function in any manner similar to that described, but are not limited to such.

Plot 1200 shows three waveforms—Reference Clock 301, Target Clock 304, and skewed Target Clock 1201. The DLL is designed to place an incoming forwarded clock (i.e., Target Clock) at exactly the center of the eye that it measures. This center of the eye is referred to as 90° placement since this is the same position as ¼ of a sine wave. The 270° position is the center of the subsequent eye with the 0°, 180°, and 360° positions being transition edges.

In one embodiment, the DLL is set up to center to this point and it may adjust itself to overcome most production and design anomalies to achieve the perfect 90° target. This provides a very solid basis for a placement system, but there are also things that will prefer that the placement is not exactly 90°. One example of this is the type of Rx (receiver) on the data lanes and how responsive to clock edges it is. Some Rxs have large positive setup times, others have negative setup times. Maybe the Rx has an unusually large hold time. To a large degree, this is known before production through simulations, but it is hard to ever get this exactly right before an actual circuit is tested. In such a case, it is possible to want the Target Clock placement at 88° or 93°. Waveform 1201 shows an example of the Target Clock that is not centered at 90° but for various reasons is better for overall system performance than the positioning of clock 304.

Figure 13:
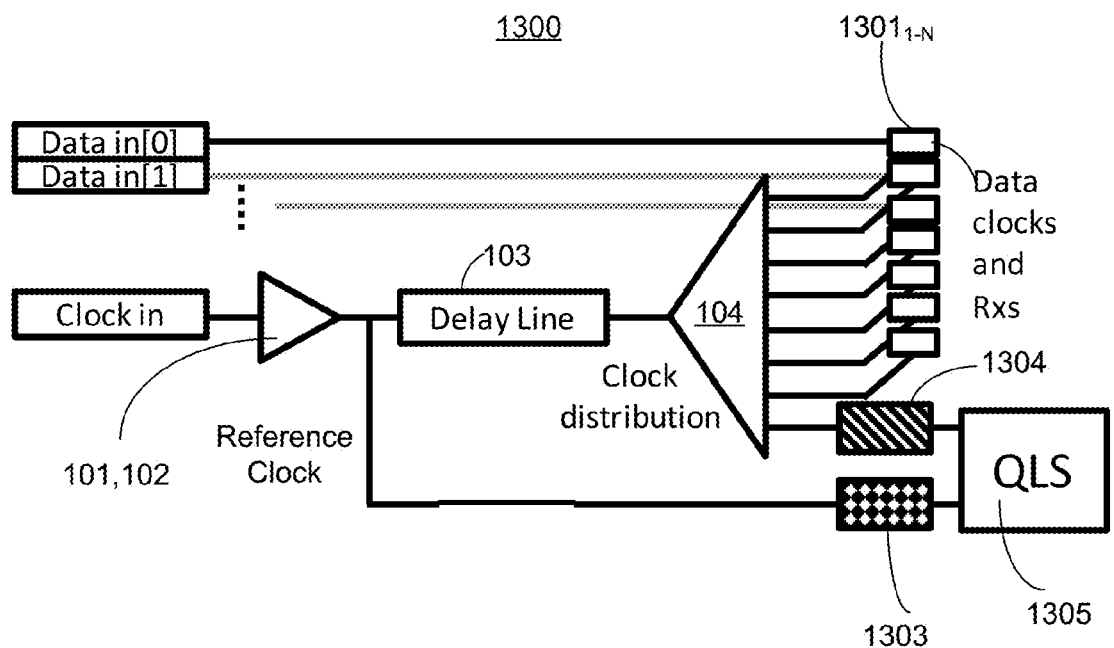
FIG. 13 illustrates a forwarded clock and data apparatus with offset insertion points, according to one embodiment of the disclosure.

FIG. 13 illustrates a forwarded clock and data apparatus 1300 with offset insertion points, according to one embodiment of the disclosure. It is pointed out that those elements of FIG. 13 having the same reference numbers (or names) as the elements of any other figure can operate or function in any manner similar to that described, but are not limited to such.

In one embodiment, apparatus 1300 includes input clock buffer(s) 101 and 102, Monotonic Delay Line 103, Clock Distribution network 104, receivers (Rxs) 1301$_{1-N}$, where 'N' is an integer, offset circuit 1304, offset circuit 1303, and Quadrature Lock Sensor (QLS) 1305. QLS 1305 is also referred as the placement sensor which includes blocks 106, 110, and 111.

In one embodiment, Reference Clock is received by buffers 101 and 102 and provided to Monotonic Delay Line 103. In one embodiment, Monotonic Delay Line 103 is controlled by FSM 107 such that output (i.e., Target Clock) of Monotonic Delay Line 103 is positioned at a known delay point relative to Reference Clock. In one embodiment, this Target Clock is received by Clock Distribution network 104 which provides the Target Clock to Rxs 1301$_{1-N}$ for sampling incoming data (i.e., Data_in[0]-[N], respectively).

In one embodiment, QLS 1305 measures what is presented to it. In one embodiment, QLS 1305 compares the placement of two clocks with respect to each other—one being the Reference Clock and the other being the Target Clock provided by Clock Distribution 104. Here, LCMs 105 are part of Rxs 1301$_{1-N}$. In one embodiment, QLS 1305 generates an output that indicates the alignment between the reference and target clocks. Assuming no offset circuits 1304 and 1303, QLS 1305 will send alignment data to FSM 107 such that the Target Clock is aligned at the perfect 90° lock target 304 relative to the Reference Clock 301 as seen in 1200. In one embodiment, to accommodate specific receiver preferences that may have setup or hold times that prefer a placement other than 90°, offset inducing circuits 1303 and 1304 are introduced to systematically center the clock off, but close to 90°. In one embodiment, the resulting clock with a particular offset is depicted as 1201.

In one embodiment, if the delivery of either of the clocks (Reference or target) to QLS 1305 is incorrect, that may cause the effective Target Clock placement to be incorrect by the same amount, even though the DLL/QLS itself thinks it is doing a perfect placement job. One reason for this is that QLS 1305 may not be able to measure what is out if its purview, and the DLL may not correct for anything it cannot measure. There can also be simulation errors or systematic manufacturing issues that were unforeseen at the time of design that can contribute to clock delivery errors to the placement sensor.

In one embodiment, to overcome the potential inaccuracy in placing the Target Clock is to have a mechanism in place such that the perfect 90° placement can be shifted early or late but the DLL can still function properly and hold a precise placement lock. Adjusting anything in the clock path that is in common with the data Rxs (e.g. the Clock Distribution network 104) may be futile as the DLL will see that change and dial it out.

In one embodiment, a delay is added to or subtracted from the clock path (i.e., path from buffer output 101/102 to QLS 1305) that is not common with the data Rxs 1301$_{1-N}$ i.e., either adding or subtracting delay to the Reference Clock, after it has split off from the main clock path, or removing or applying delay on a Target Clock branch that is dedicated to the DLL. In one embodiment, addition of delay to the Reference Clock path is done by offset circuit 1303. In one embodiment, addition of delay to the Target Clock path is done by offset circuit 1304.

In one embodiment, QLS 1305 is "tricked" into measuring a misplacement that may not actually exist. For example, if the Target Clock is already at 90° but QLS 1305 is tricked into thinking it is earlier or later than that, it will automatically adjust itself and the clock placement until it determines that it is back at 90°. In such an embodiment, QLS 1305 continues to hold position at this point and even track environmental changes to what it thinks is 90° even though the real placement has been moved to some other place that is better than 90° from a system perspective.

To further the example, assume that the delays for offset circuits 1303 and 1304 are matched and QLS 1305 has the clock locked at the correct 90° target location 304. But, the alignment of 1201 is desired instead. If a delay of the difference between 1201 and 304 is realized by offset circuit 1303, QLS 1305 placement sensor will perceive Reference Clock 301 being later in time than it really is. To achieve a perceived 90° placement for the Target Clock, QLS 1305 will request the FSM 107 to add delay to the Delay Line 103 to delay the Target Clock until a perceived 90° lock is achieved. The reality, that is intentionally obscured from the measurement devices, is that the Reference Clock is not delayed (it is delayed only to the sensor), but now the Target Clock is artificially delayed by an amount that places it at a lock point greater than 90° and the stable but offset positioning of 1201 is achieved. In one embodiment, QLS 1305 performs the measurements and requests FSM 107 for more or less delay.

The embodiments can be applied on a static or on-the-fly basis. For example, offset delay can be chosen and applied either up front (i.e., static) or at any time the DLL is in operation (i.e., on-the-fly). In one embodiment, the static application looks to the DLL like the environment the DLL finds itself in from manufacturing and operates as usual. In one embodiment, the on-the-fly application looks like a severe environmental change to the DLL, but because the DLL can continually adjust, it adapts to the offset application by adjusting the Target Clock placement as rapidly as it can and then holding it indefinitely or until a new offset is applied.

In one embodiment, the end result of offset application using the previously described method is just like adding offset via offset circuits 1303 and 1304. In one embodiment, QLS 1305 works by taking two measurements (A and B) and making a decision. Measurements A and B are achieved by sending the two clocks (i.e., Reference and Target Clocks) down alternating paths. In one embodiment, one of the paths is a short and fixed path, and the other path is an adjustable and longer path. In one embodiment, the short path is the output of 106 to the clock input of 111 while the longer and adjustable path is the output of 106, through 110, and into the data input of 111. In one embodiment, after sending the two clocks down the alternating paths, the arrival times of the two clocks are measured at a common circuit.

In one embodiment, the delay of the longer path is the same for the A and B measurements and is controlled by QLS 1305 to be a delay of 90° relative to the short path. In one embodiment, the offset works by dynamically changing the delay of the longer path differently for each A or B measurement without QLS 1305 knowing about it. In such an embodiment, the offset will cause an otherwise perfect 90° alignment reading to be fast or slow by the amount of the offset and QLS 1305 will in turn correct for that perceived misalignment.

In one embodiment, the math involved to change the delay may happen every measurement while still allowing QLS 1305 to adjust the "nominal" delay to keep the clock placed at virtual 90° throughout environmental changes.

As an example, the QLS normally adjusts its delay line 110 to have a delay of 90° which is a fixed number of ps for a given clock frequency. Assume this delay to be 'Q.' For measurements A and B, and operation without offsets, 'Q' is a static value and QLS 1305 continually measures that delay to make sure it is always 90°. The delay through 110 remains the same for both measurements A and B. When offsets are introduced they are done so by dynamically changing the actual delay value of 110 to be something other than 'Q.' In this example, the delay to be applied to the A and B measurements is the same except with a sign reversal. Assume this applied offset inducing delay is 'D.' For measurement A, the delay through 110 is set to Q+D. For measurement B, the delay through 110 is set to Q-D. This process repeats continuously. Because +D and −D are applied sequentially, the QLS' measurement system of 110 still believes 110 has a delay of 'Q.' If it did not, it would try to adjust 110 which would defeat the purpose of the offset application. Since 110 is still perceived to have the nominal delay of Q, the DLL is stable but since each measurement A and B have been altered, the data 114 signals sent to the FSM 107 result is an offset applied to the Target Clock.

In the example above, given the right value of 'D,' the offset of 1201 can be realized. A polarity reversal on 'D' may result in a Target Clock positioning of less than 90°. In one embodiment, FSM 107 is part of the offset application and for both static and on-the-fly usages, it changes from no offset and no math to keeping track of the original virtual placement while continually calculating new offset delays for the sensor. In one embodiment, the method of offset application may be implemented as a soft control method since there are no hardware changes necessary other than the addition of the control and arithmetic logic in the FSM 107. In one embodiment, the previous method described involving offset circuits 1303 and 1304 can be thought of as more of a hard control method since extra offset hardware may be added.

In one embodiment, the DLL also has an integrated DCS (Duty Cycle Sensor) which can measure the Duty Cycle Distortion of a clock signal and report that to FSM 107 which can then take action to correct the distortion. In one embodiment, the architecture of QLS 1305 and DCS are similar. In such an embodiment, the same soft offset mechanism described for QLS 1305 can also be independently applied to the DCS. The offset application to the DCS may result in a Target Clock that either has intentional DCD or better DC correction due to a design fault or other systematic issue that could not be designed for. In one embodiment, different offsets can be applied to QLS 1305 and DCS simultaneously. In such an embodiment, the logical control of each rising and falling clock edge is flexible to satisfy complex placement scenarios.

Figure 14:
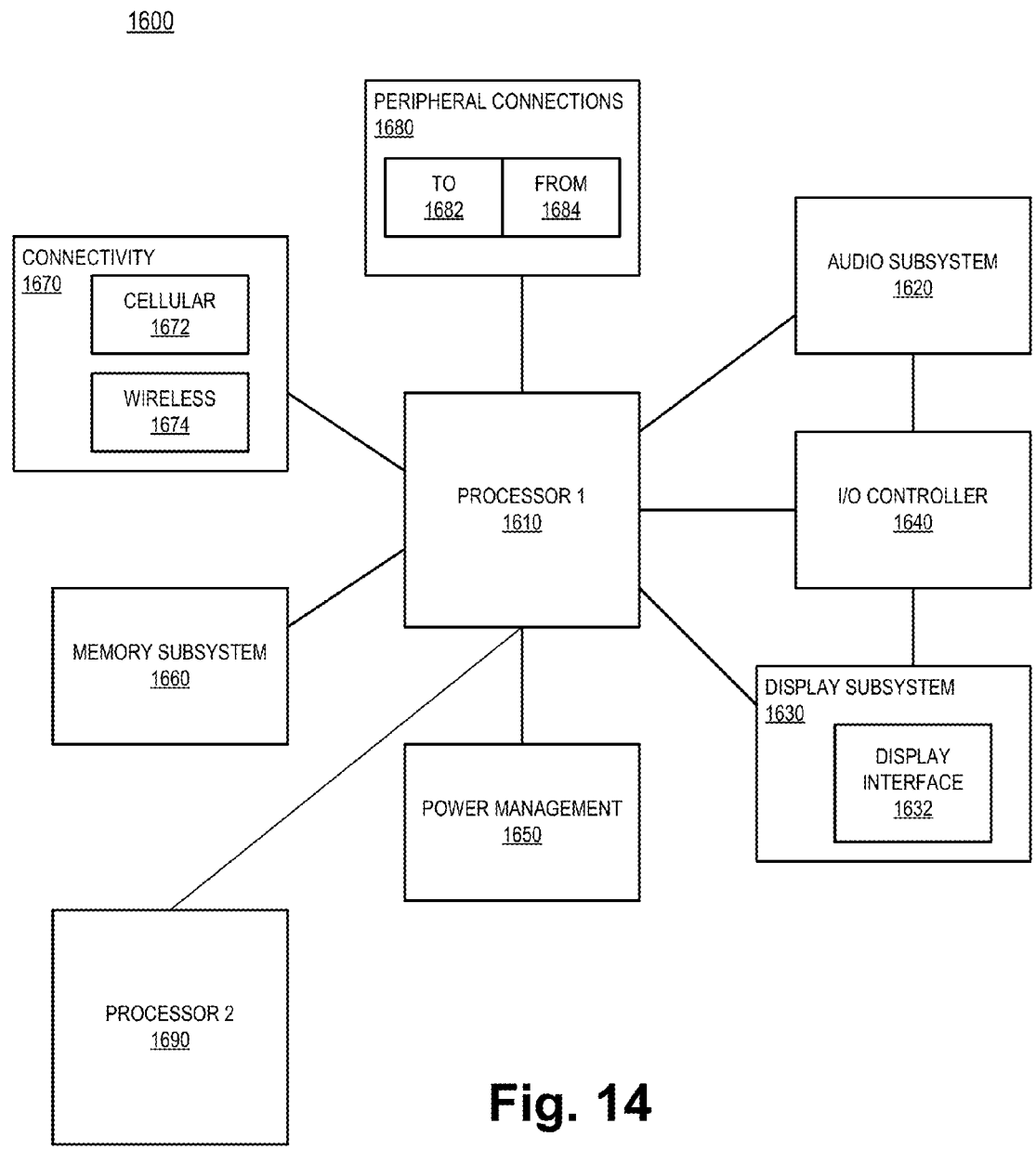
FIG. 14 is a smart device or a computer system or an SoC (System-on-Chip) with monotonic delay line with phase interpolation and other apparatus described here, according to one embodiment of the disclosure.

FIG. 14 is a smart device or a computer system or an SoC (System-on-Chip) with any of the embodiments described above, according to one embodiment of the disclosure. FIG. 14 is a smart device or a computer system or an SoC (System-on-Chip) 1600 with power regulator with continuous controlled mode regulation of supply for multiple adjustable loads, according to one embodiment of the disclosure. It is pointed out that those elements of FIG. 14 having the same reference numbers (or names) as the elements of any other figure can operate or function in any manner similar to that described, but are not limited to such.

FIG. 14 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with any of the embodiments described above. In one embodiment, computing device 1600 includes any of the embodiments described above. In one embodiment, second processor 1690 is optional. Other blocks of the computing device 1600 with I/O drivers may also include any of the embodiments described above. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a delay line including at least four delay stages coupled together in a series; a first multiplexer having a first input coupled to an output of a first delay stage of the at least four delay stages, and a second input coupled to an output of a third delay stage of the at least four delay stages; a second multiplexer having a first input coupled to an output of a second delay stage of the at least four delay stages, and a second input coupled to an output of a fourth delay stage of the at least four delay stages; and a phase interpolator coupled to outputs of the first and second multiplexers, the phase interpolator having an output.

In one embodiment, the apparatus a controller to generate select signals for the first and second multiplexers. In one embodiment, the controller to generate control signals for the phase interpolator. In one embodiment, the controller to initially shift the output in time via the select signals for the first and second multiplexers while keeping the control signals for the phase interpolator constant, and then to adjust the output in time via control signals for the phase interpolator while keeping the select signals for the first and second multiplexers constant.

In one embodiment, the controller to periodically adjust control signals for the interpolator to adjust the output. In one embodiment, a time period for periodically adjusting is programmable time period. In one embodiment, the phase interpolator comprises a first set of mixers that receive output of the first multiplexer. In one embodiment, the phase interpolator comprises a second set of mixers that receive output of the second multiplexer. In one embodiment, the controller to select different input than before for one of the first and second multiplexers when one of the first or second sets of mixers is operating at its maximum mixing range.

In another example, a system is provided which comprises: a memory unit; a processor coupled to the memory unit, the processor including: a delay line including at least four delay stages coupled together in a series; a first multiplexer having a first input coupled to an output of a first delay stage of the at least four delay stages, and a second input coupled to an output of a third delay stage of the at least four delay stages; a second multiplexer having a first input coupled to an output of a second delay stage of the at least four delay stages, and a second input coupled to an output of a fourth delay stage of the at least four delay stages; and a phase interpolator coupled to outputs of the first and second multiplexers, the phase interpolator having an output; and a wireless interface for allowing the processor to communicate with another device.

In one embodiment, the system further comprises: a display unit to display content processed by the processor. In one embodiment, the display unit is touch screen. In one embodiment, the processor further comprises a controller to generate select signals for the first and second multiplexers. In one embodiment, the controller to generate control signals for the phase interpolator. In one embodiment, the controller to initially shift the output in time via the select signals for the first and second multiplexers while keeping the control signals for the phase interpolator constant, and then to adjust the output in time via control signals for the phase interpolator while keeping the select signals for the first and second multiplexers constant.

In one embodiment, the phase interpolator comprises a first set of mixers that receive output of the first multiplexer. In one embodiment, the phase interpolator comprises a second set of mixers that receive output of the second multiplexer. In one embodiment, the controller to select different input than before for one of the first and second multiplexers when one of the first or second sets of mixers is operating at its maximum mixing range.

In another example, an apparatus is provided which comprises: a first node to provide a target clock; a second node to provide a reference clock; a first sensor to compare a delayed version of the target clock with the reference clock to generate a first sensor output; and a second sensor to compare the target clock with a delayed version of the reference clock to generate a second sensor output. In one embodiment, the first sensor output partially overlaps in duration over the second sensor output. In one embodiment, the apparatus further comprises a third sensor to compare an inverted version of the target clock with a buffered version of the reference clock to generate a third sensor output.

In one embodiment, the first sensor output partially overlaps in duration over the third sensor output. In one embodiment, the apparatus further comprises a finite state machine (FSM) to receive first, second, and third sensor outputs, and to determine rise safe zone and fall safe zone for placing the target clock. In one embodiment, the FSM generates an output for a delay locked loop (DLL) when all first, second, and third sensor outputs assert. In one embodiment, the apparatus further comprises: an inverter to generate the inverted version of the target clock; and a buffer to generate the buffered version of the reference clock, wherein the buffer to have a propagation delay longer than propagation delay of the inverter.

In one embodiment, the third sensor comprises a sampler to sample delayed version of the reference clock with an inverted version of the target clock, the output of the sampler being the third sensor output. In one embodiment, the first sensor comprises a sampler to sample the reference clock with the delayed version of the target clock, the output of the sampler being the first sensor output. In one embodiment, the second sensor comprises a sampler to sample a delayed version of the reference clock with the target clock, the output of the sampler being the second sensor output.

In another example, a voltage regulator to provide power; a delay locked loop (DLL) to receive power from the voltage regulator; one or more registers to store operational parameters of the DLL; a memory; and a controller to transfer the stored operational parameters from the one or more registers to the memory in response to an event.

In one embodiment, the apparatus further comprises a traffic controller to monitor data traffic to an input-output receiver having the DLL. In one embodiment, the traffic controller instructs the controller to transfer the stored operational parameters from the one or more registers to the memory one or more clock cycles before the event. In one embodiment, traffic controller instructs the controller to transfer the stored operational parameters from the memory to the one or more registers after the event is over.

In one embodiment, the apparatus further comprises another voltage regulator to provide power to the memory. In one embodiment, the memory is a non-volatile memory. In one embodiment, the controller to periodically transfer the stored operational parameters from the one or more registers to the memory. In one embodiment, the event is a power down event. In one embodiment, the controller to transfer the stored operational parameters from the memory to the one or more registers after the event is over. In one embodiment, the operational parameters include control code for an interpolator of the DLL. In one embodiment, the operational parameters include fine control code and coarse control code.

In another example, a system is provided which comprises: a memory unit; a processor coupled to the memory, the processor including: a voltage regulator to provide power; a delay locked loop (DLL) to receive power from the voltage regulator; one or more registers to store operational parameters of the DLL; a memory; and a controller to transfer the stored operational parameters from the one or more registers to the memory in response to an event; and a wireless interface for allowing the processor to communicate with another device.

In one embodiment, the system further comprises a display unit. In one embodiment, the processor includes apparatus according to the apparatus discussed above.

In another example, an apparatus is provided which comprises: a delay locked loop (DLL) to receive a reference clock and to generate a target clock; and a first offset circuit operable to add delay to the reference clock, the first offset circuit disposed in a signal path de-coupled from DLL. In one embodiment, the apparatus further comprises: a second offset circuit operable to add delay to the target clock, the second offset circuit disposed in a signal path associated with the DLL.

In one embodiment, the apparatus further comprises: a sensor to receive output of the first and second offset circuits, the sensor to generate an output that indicates a phase difference between the first and second offset circuits. In one embodiment, the first and second offset circuits are operable to add a programmable delay to the reference and target clocks respectively.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a delay line including at least four delay stages coupled together in a series;
a first multiplexer having a first input coupled to an output of a first delay stage of the at least four delay stages, and a second input coupled to an output of a third delay stage of the at least four delay stages;
a second multiplexer having a first input coupled to an output of a second delay stage of the at least four delay stages, and a second input coupled to an output of a fourth delay stage of the at least four delay stages;
a phase interpolator coupled to outputs of the first and second multiplexers, the phase interpolator having an output; and
a controller to generate control signals for the phase interpolator, the controller to adjust control signals for the interpolator in order to adjust the output periodically based on a programmable time period.

2. The apparatus of claim 1, wherein the controller to generate select signal for the first and second multiplexers.

3. The apparatus of claim 2, wherein the controller to initially shift the output in time via the select signals for the first and second multiplexers while keeping the control signals for the phase interpolator constant, and then to adjust the output in time via control signals for the phase interpolator while keeping the select signals for the first and second multiplexers constant.

4. The apparatus of claim 1, wherein the phase interpolator comprises a first set of mixers that receive output of the first multiplexer.

5. The apparatus of claim 4, wherein the phase interpolator comprises a second set of mixers that receive output of the second multiplexer.

6. The apparatus of claim 5, wherein the controller to select different input than before for one of the first and second multiplexers when one of the first or second sets of mixers is operating at its maximum mixing range.

7. A system comprising:
a memory unit;
a processor coupled to the memory unit, the processor including:
a delay line including at least four delay stages coupled together in a series;
a first multiplexer having a first input coupled to an output of a first delay stage of the at least four delay stages, and a second input coupled to an output of a third delay stage of the at least four delay stages;
a second multiplexer having a first input coupled to an output of a second delay stage of the at least four delay stages, and a second input coupled to an output of a fourth delay stage of the at least four delay stages;
a phase interpolator coupled to outputs of the first and second multiplexers, the phase interpolator having an output; and
a controller to generate control signals for the phase interpolator, the controller to adjust control signals in order to adjust the output periodically based on a programmable time period; and
a wireless interface for allowing the processor to communicate with another device.

8. The system of claim 7 further comprises a display unit to display content processed by the processor.

9. An apparatus comprising:
a delay line including at least four delay stages coupled together in a series;
a first multiplexer having a first input coupled to an output of a first delay stage of the at least four delay stages, and a second input coupled to an output of a third delay stage of the at least four delay stages;
a second multiplexer having a first input coupled to an output of a second delay stage of the at least four delay stages, and a second input coupled to an output of a fourth delay stage of the at least four delay stages;
a phase interpolator coupled to outputs of the first and second multiplexers, the phase interpolator having an output, wherein the phase interpolator comprises a first set of mixers that receive output of the first multiplexer and a second set of mixers that receive output of the second multiplexer; and
a controller to select a different input than before for one of the first and second multiplexers when one of the first or second sets of mixers is operating at its maximum mixing range.

* * * * *